US006909086B2

(12) United States Patent
Samukawa et al.

(10) Patent No.: US 6,909,086 B2
(45) Date of Patent: Jun. 21, 2005

(54) NEUTRAL PARTICLE BEAM PROCESSING APPARATUS

(75) Inventors: Seiji Samukawa, Miyagi (JP); Katsunori Ichiki, Kanagawa (JP); Kazuo Yamauchi, Kanagawa (JP); Hirokuni Hiyama, Kanagawai (JP)

(73) Assignees: Ebara Corporation, Tokyo (JP); Japan as represented by President of Tohoku University, Miyagi (JP)

( * ) Notice: Subject to any disclaimer, the term of this patent is extended or adjusted under 35 U.S.C. 154(b) by 0 days.

(21) Appl. No.: 10/471,742

(22) PCT Filed: Mar. 22, 2002

(86) PCT No.: PCT/JP02/02747

§ 371 (c)(1), (2), (4) Date: Sep. 24, 2003

(87) PCT Pub. No.: WO02/078407

PCT Pub. Date: Oct. 3, 2002

(65) Prior Publication Data

US 2004/0119006 A1 Jun. 24, 2004

(30) Foreign Application Priority Data

Mar. 26, 2001 (JP) ....................................... 2001-088859

(51) Int. Cl.[7] .......................... H01L 21/306; H05H 3/00

(52) U.S. Cl. ................ 250/251; 250/423 R; 313/359.1; 313/362.1; 313/363.1; 315/111.21; 315/111.31

(58) Field of Search ............................ 250/251, 423 R; 313/359.1, 362.1, 363.1; 315/111.21, 111.31

(56) References Cited

U.S. PATENT DOCUMENTS

| | | | | | |
|---|---|---|---|---|---|
| 5,518,572 | A | * | 5/1996 | Kinoshita et al. | 156/345.34 |
| 5,818,040 | A | * | 10/1998 | Kinoshita et al. | 250/251 |
| 2004/0070348 | A1 | * | 4/2004 | Ichiki et al. | 315/111.21 |
| 2004/0108470 | A1 | * | 6/2004 | Ichiki et al. | 250/492.21 |

FOREIGN PATENT DOCUMENTS

| | | |
|---|---|---|
| EP | 0 531 949 | 3/1993 |
| EP | 0 790 757 | 8/1997 |

* cited by examiner

*Primary Examiner*—Nikita Wells
(74) *Attorney, Agent, or Firm*—Westerman, Hattori, Daniels & Adrian, LLP

(57) ABSTRACT

A neutral particle beam processing apparatus comprises a workpiece holder (20) for holding a workpiece (X), a plasma generator for generating a plasma in a vacuum chamber (3) by applying a high-frequency electric field, an orifice electrode (4) disposed between the workpiece holder (20) and the plasma generator, and a grid electrode (5) disposed upstream of the orifice electrode (4) in the vacuum chamber (3). The orifice electrode (4) has orifices (4*a*) defined therein. The neutral particle beam processing apparatus further comprises a voltage applying unit for applying a voltage between the orifice electrode (4) which serves as an anode and the grid electrode (5) which serves as a cathode, while the high-frequency electric field applied by the plasma generator is being interrupted, to accelerate negative ions in the plasma generated by the plasma generator and pass the accelerated negative ions through the orifices (4*a*) in the orifice electrode (4).

16 Claims, 6 Drawing Sheets

NEUTRAL PARTICLE BEAM PROCESSING APPARATUS

TECHNICAL FIELD

The present invention relates to a neutral particle beam processing apparatus, and more particularly to a neutral particle beam processing apparatus for generating a highly directional and highly dense neutral particle beam from a high-density plasma and processing a workpiece with the generated neutral particle beam.

BACKGROUND ART

In recent years, semiconductor integrated circuits, information storage media such as hard disks, micromachines, and the like have been processed in highly fine patterns. In the fields of processing such workpieces, attention has been attracted to the use of an energetic beam such as a high-density ion beam which is highly linear, i.e., highly directional, and has a relatively large beam diameter. For example, the energetic beam is applied to a workpiece for depositing a film thereon or etching the workpiece.

As beam sources of such energetic beams, there have been used beam generators which generate various kinds of beams including a positive ion beam, a negative ion beam, and a radical beam. The positive ion beam, the negative ion beam, or the radical beam is applied to a desired area of a workpiece from the beam source, for thereby locally depositing a film on the workpiece, etching the workpiece, modifying the surface of the workpiece, or joining or bonding parts of the workpiece.

In the case of a beam source which applies charged particles such as positive ions or negative ions to a workpiece, an insulated workpiece cannot be processed because of a charge build-up phenomenon in which electric charges are built up on the workpiece. Further, since the ion beam emitted from the beam source tends to spread due to the space-charge effect, the workpiece cannot be processed in a fine pattern.

In order to solve the above problems, there has been proposed a method of introducing electrons into the ion beam to neutralize the electric charges. This method can balance the electric charges on the workpiece on the whole. However, since local unbalance of the electric charges still remains on the workpiece, the workpiece cannot be processed in a fine pattern.

In the case where ions are extracted from a plasma source and applied to a workpiece, if a radiation (e.g., an ultraviolet ray) produced by the plasma source is applied to the workpiece, then the radiation adversely affects the workpiece. Thus, it is necessary to shield the workpiece from an adverse radiation (e.g., an ultraviolet ray) emitted from the plasma source.

DISCLOSURE OF INVENTION

The present invention has been made in view of the above drawbacks. It is therefore an object of the present invention to provide a neutral particle beam processing apparatus which can apply an energetic beam having a large beam diameter to a workpiece with an inexpensive and compact structure, and can neutralize ions with a high neutralization efficiency to process the workpiece without a charge build-up or damage.

According to a first aspect of the present invention, there is provided a neutral particle beam processing apparatus comprising: a workpiece holder for holding a workpiece; a plasma generator for generating a plasma in a vacuum chamber by applying a high-frequency electric field; an orifice electrode disposed between the workpiece holder and the plasma generator, the orifice electrode having orifices defined therein; a grid electrode disposed upstream of the orifice electrode in the vacuum chamber; and a voltage applying unit for applying a voltage between the orifice electrode which serves as an anode and the grid electrode which serves as a cathode, while the high-frequency electric field applied by the plasma generator is being interrupted, to accelerate negative ions in the plasma generated by the plasma generator and pass the accelerated negative ions through the orifices in the orifice electrode.

With the above arrangement, since the workpiece can be processed by a neutral particle beam having no electric charges but having a large translational energy, various processes including an etching process and a deposition process can be performed on the workpiece with high accuracy in such a state that an amount of charge build-up is reduced. Particularly, when the orifice electrode is used for neutralizing the negative ions, a high neutralization efficiency can be obtained, and hence a beam diameter of an energetic beam can be increased inexpensively without increasing the size of the apparatus. Further, since the generated plasma is isolated from the workpiece by the orifice electrode, a radiation produced by the plasma is not substantially applied to the workpiece. Therefore, it is possible to reduce adverse effects on the workpiece due to the radiation such as an ultraviolet ray which would otherwise damage the workpiece.

According to a second aspect of the present invention, there is provided a neutral particle beam processing apparatus comprising: a workpiece holder for holding a workpiece; an orifice electrode disposed in a vacuum chamber, the orifice electrode having orifices defined therein; a second electrode disposed upstream of the orifice electrode in the vacuum chamber; a first voltage applying unit for applying a high-frequency voltage between the orifice electrode and the second electrode to generate a plasma between the orifice electrode and the second electrode; and a second voltage applying unit for applying a voltage between the orifice electrode which serves as an anode and the second electrode which serves as a cathode, while the high-frequency electric field applied by the first voltage applying unit is being interrupted, to accelerate negative ions in the plasma generated by the first voltage applying unit and pass the accelerated negative ions through the orifices in the orifice electrode.

With the above arrangement, the orifice electrode serves not only to neutralize the negative ions, but also to generate the plasma. Therefore, a high neutralization efficiency can be obtained by the orifice electrode, and simultaneously it is not necessary to provide a separate plasma generator for generating a plasma. Thus, the neutral particle beam processing apparatus can be made compact in structure, and a beam diameter of an energetic beam can be increased inexpensively.

Preferably, the orifice electrode has a thickness which is at least twice the diameter of the orifices defined therein. When the orifice electrode has a thickness which is at least twice the diameter of the orifices, it is possible to increase the probability that the negative ions are neutralized in the orifices, and to remarkably reduce the intensity of a radiation to be applied to the workpiece from the plasma.

Preferably, the orifice electrode is made of an electrically conductive material. With the orifice electrode made of an electrically conductive material, a positive DC voltage and a negative DC voltage may selectively be applied to the orifice electrode to accelerate both positive ions and negative ions in the plasma. If a low-frequency voltage having a frequency of about 400 kHz is applied to the orifice electrode, then it is possible to accelerate positive ions and negative ions alternately. In this case, the surfaces of the orifice electrode may be covered with dielectric films.

The above and other objects, features, and advantages of the present invention will be apparent from the following description when taken in conjunction with the accompanying drawings which illustrates preferred embodiments of the present invention by way of example.

BEST MODE FOR CARRYING OUT THE INVENTION

A neutral particle beam processing apparatus according to a first embodiment of the present invention will be described in detail below with reference to FIGS. 1 through 3.

Figure 1:
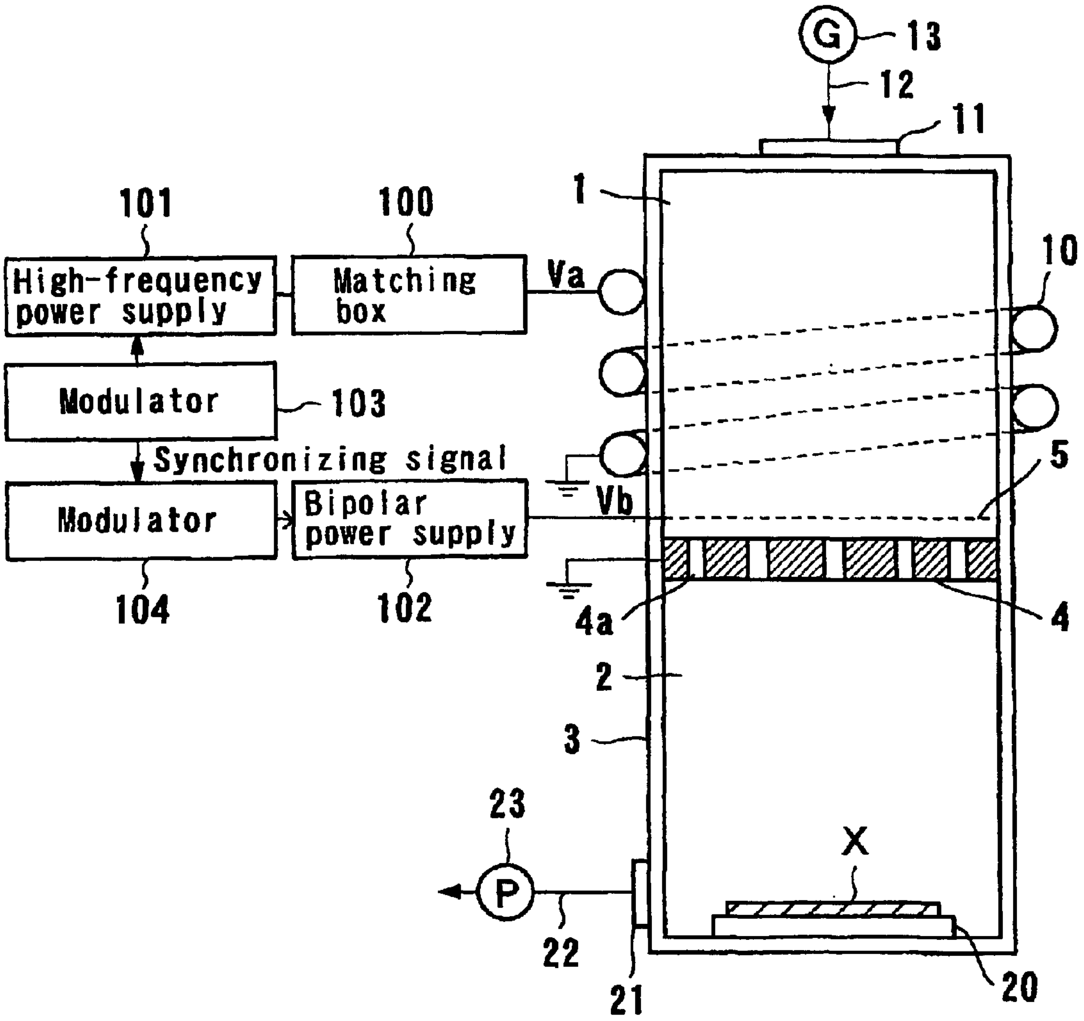
FIG. 1 is a schematic view showing a whole arrangement of a neutral particle beam processing apparatus according to a first embodiment of the present invention.

FIG. 1 is a schematic view showing a whole arrangement of a neutral particle beam processing apparatus according to a first embodiment of the present invention, with electric components in block form. As shown in FIG. 1, the neutral particle beam processing apparatus comprises a cylindrical vacuum chamber 3 constituted by a beam generating chamber 1 for generating a neutral particle beam and a process chamber 2 for processing a workpiece X such as a semiconductor substrate, a glass workpiece, an organic workpiece, a ceramic workpiece, or the like. The beam generating chamber 1 of the vacuum chamber 3 has walls made of quartz glass or ceramics, and the process chamber 2 of the vacuum chamber 3 has walls made of metal.

The beam generating chamber 1 has a coil 10 disposed therearound for inductively coupled plasma (ICP). The coil 10 is housed in a water-cooled tube having an outside diameter of 8 mm, for example. The coil 10 of about two turns is wound around the beam generating chamber 1. The coil 10 is electrically connected through a matching box 100 to a high-frequency power supply 101, which applies a high-frequency voltage having a frequency of about 13.56 MHz, for example, to the coil 10. When a high-frequency current is supplied from the high-frequency power supply 101 via the matching box 100 to the coil 10, an induced magnetic field is produced in the beam generating chamber 1 by the coil 10. The varying magnetic field induces an electric field, which accelerates electrons to generate a plasma in the beam generating chamber 1. Thus, the coil 10, the matching box 100, and the high-frequency power supply 101 constitute a plasma generator for generating a plasma in the beam generating chamber 1.

The beam generating chamber 1 has a gas inlet port 11 defined in an upper portion thereof for introducing a gas into the beam generating chamber 1. The gas inlet port 11 is connected through a gas supply pipe 12 to a gas supply source 13, which supplies a gas such as $SF_6$, $CHF_3$, $CF_4$, $Cl_2$, Ar, $O_2$, $N_2$, and $C_4F_8$ to the beam generating chamber 1.

The process chamber 2 houses a workpiece holder 20 therein for holding a workpiece X. The workpiece X is placed on an upper surface of the workpiece holder 20. The process chamber 2 has a gas outlet port 21 defined in a sidewall thereof for discharging the gas from the process chamber 2. The gas outlet port 21 is connected through a gas outlet pipe 22 to a vacuum pump 23, which operates to maintain the process chamber 2 at a predetermined pressure.

An orifice plate (orifice electrode) 4 made of an electrically conductive material such as graphite is disposed in the lower end of the beam generating chamber 1 and electrically grounded. A thin-plate grid electrode 5 made of an electrically conductive material is disposed above the orifice electrode 4. The grid electrode 5 is electrically connected to a bipolar power supply (voltage applying unit) 102.

Figure 2A:
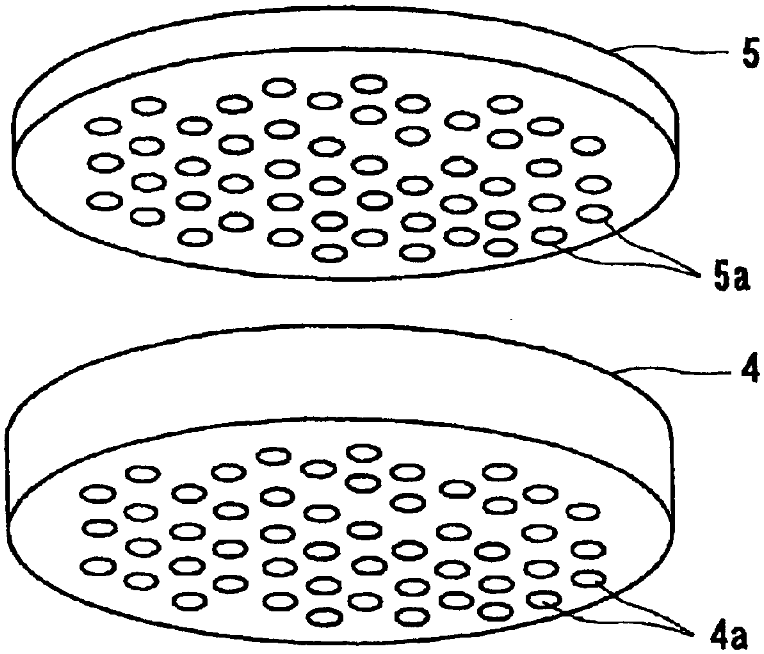
FIG. 2A is a perspective view showing an orifice electrode and a grid electrode in the neutral particle beam processing apparatus shown in FIG. 1.
Figure 2B:
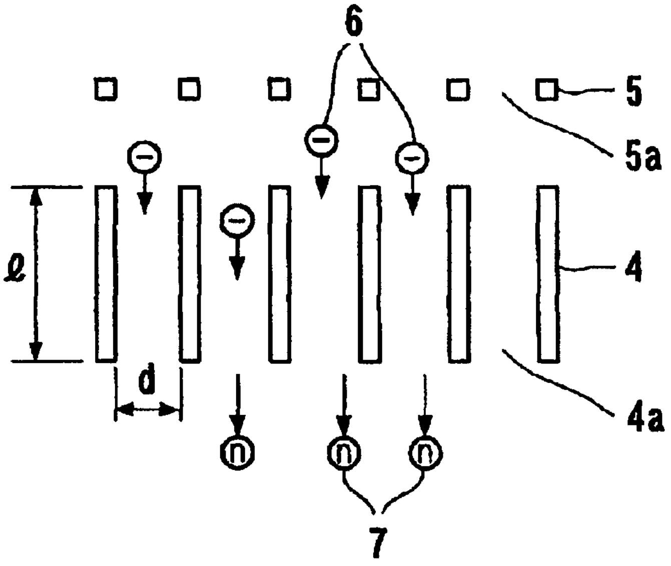
FIG. 2B is a vertical cross-sectional view partially showing the orifice electrode and the grid electrode shown in FIG. 2A.
Figure 3:
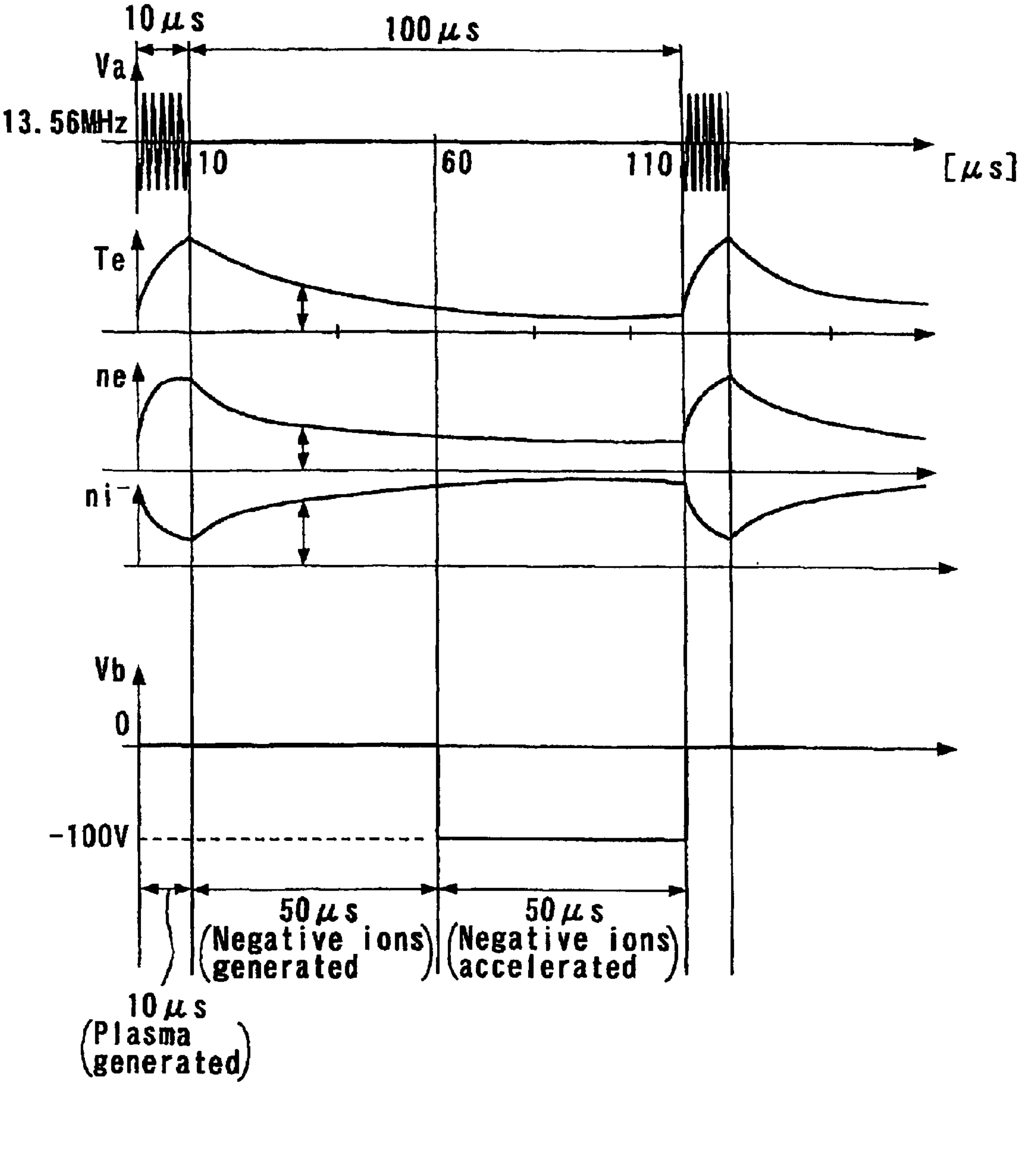
FIG. 3 is a timing chart showing operating states of the neutral particle beam processing apparatus shown in FIG. 1.

FIG. 2A is a perspective view showing the orifice electrode 4 and the grid electrode 5, and FIG. 2B is a vertical cross-sectional view partially showing the orifice electrode 4 and the grid electrode 5 shown in FIG. 2A. As shown in FIGS. 2A and 2B, the orifice electrode 4 has a number of orifices 4*a* defined therein, and the grid electrode 5 has a number of grid holes 5*a* defined therein. The grid electrode 5 may comprise a meshed wire, a punching metal, or the like.

The high-frequency power supply 101 which is connected to the coil 10 is connected a modulator 103, and the bipolar power supply 102 which is connected to the grid electrode 5 is connected to a modulator 104. Thus, the high-frequency power supply 101 and the bipolar power supply 102 are connected to each other through the modulators 103, 104. The application of the voltage by the bipolar power supply 102 is synchronized with the application of the voltage by the high-frequency power supply 101, based on synchronizing signals transmitted between the modulators 103, 104.

Operation of the neutral particle beam processing apparatus according to the first embodiment will be described below. FIG. 3 is a timing chart showing operating states of the neutral particle beam processing apparatus shown in FIG. 1. In FIG. 3, Va represents the potential of the coil 10, Te the electron temperature in the beam generating chamber 1, ne the electron density in the beam generating chamber 1, $ni^-$ the negative ion density in the beam generating chamber 1, and Vb the potential of the grid electrode 5. The timing chart is schematically shown in FIG. 3, and the shown frequencies are different from the actual frequencies, for example.

The vacuum pump 23 is driven to evacuate the vacuum chamber 3, and then a gas such as $SF_6$, $CHF_3$, $CF_4$, $Cl_2$, Ar, $O_2$, $N_2$, or $C_4F_8$ is introduced from the gas supply source 13 into the beam generating chamber 1. As shown in FIG. 3, a high-frequency voltage having a frequency of about 13.56 MHz is applied to the coil 10 for 10 microseconds by the high-frequency power supply 101, so that a high-frequency electric field is produced in the beam generating chamber 1. The gas introduced into the beam generating chamber 1 is ionized by electrons that are accelerated by the high-frequency electric field, for thereby generating a high-density plasma in the beam generating chamber 1. The plasma is mainly composed of positive ions and heated electrons.

Then, the high-frequency voltage applied by the high-frequency power supply 101 is interrupted for 100 microseconds. Thereafter, the high-frequency voltage is applied again to the coil 10 for 10 microseconds by the high-frequency power supply 101 to heat the electrons in the plasma in the beam generating chamber 1. Thus, the above cycle is repeated. In this manner, the application of the high-frequency voltage for 10 microseconds and the interruption of the high-frequency voltage for 100 microseconds are alternately repeated. The period of time (100 microseconds) for which the high-frequency voltage is interrupted is sufficiently longer than a period of time in which the electrons in the plasma are attached to the residual process gas to generate negative ions, and sufficiently shorter than a period of time in which the electron density in the plasma is lowered to extinguish the plasma. The period of time (10 microseconds) for which the high-frequency voltage is applied is long enough to recover the energy of the electrons in the plasma which has been lowered during the interruption of the high-frequency voltage.

Negative ions can be generated efficiently and continuously by interrupting the high-frequency voltage after the energy of the electrons is increased in the plasma. While ordinary plasmas are mostly composed of positive ions and electrons, the neutral particle beam processing apparatus according to the present embodiment can efficiently generate a plasma in which positive ions and negative ions coexist therein. Although the high-frequency voltage is interrupted for 100 microseconds in the above example, it may be interrupted for a period of time ranging from 50 to 100 microseconds to generate a large quantity of negative ions as well as positive ions in the plasma.

After 50 microseconds from the time when the high-frequency voltage applied by the high-frequency power supply 101 is stopped, a DC pulsed voltage of −100 V is applied to the grid electrode 5 for 50 microseconds by the bipolar power supply 102. The application of the DC voltage lowers the potential Vb of the grid electrode 5 below the potential (ground potential) of the orifice electrode 4. Thus, a potential difference is produced between the orifice electrode 4 and the grid electrode 5. In this state, the orifice electrode 4 serves as an anode, and the grid electrode 5 serves as a cathode. Therefore, the negative ions 6 (see FIG. 2B) that have passed through the grid electrode 5 toward the orifice electrode 4 are accelerated toward the orifice electrode 4 by the potential difference and introduced into the orifices 4*a* defined in the orifice electrode 4.

Most of the negative ions 6 that are passing through the orifices 4*a* in the orifice electrode 4 are collided with the sidewall surfaces of the orifices 4*a* and hence neutralized in the vicinity of solid sidewall surfaces of the orifices 4*a*, or are collided with gas molecules remaining within the orifices 4*a* and hence neutralized by charge exchange with the gas molecules. Thus, the negative ions 6 are converted into neutral particles 7 (see FIG. 2B). The negative ions 6 that have been neutralized when passing through the orifices 4*a*, i.e., the neutral particles 7, are then emitted as an energetic beam into the process chamber 2. The neutral particles 7 travel directly in the process chamber 2 and are applied to the workpiece X placed on the workpiece holder 20, for thereby etching the surface of the workpiece X, cleaning the surface of the workpiece X, modifying (e.g., nitriding or oxidizing) the surface of the workpiece X, or depositing a film on the workpiece X.

The orifice electrode 4 serves not only to neutralize the negative ions, but also to prevent a radiation produced by the plasma from being applied to the workpiece X. Specifically, since the beam generating chamber 1 where the plasma is generated is isolated from the workpiece X by the orifice electrode 4, the radiation produced by the plasma is not substantially applied to the workpiece X. Therefore, it is possible to reduce adverse effects on the workpiece X due to the radiation such as an ultraviolet ray which would otherwise damage the workpiece X.

The orifice electrode 4 should preferably have a thickness "l" (see FIG. 2B) which is at least twice the diameter "d" (see FIG. 2B) of the orifices 4*a*. When the orifice electrode 4 has a thickness "l" which is at least twice the diameter "d" of the orifices 4*a*, it is possible to increase the probability that the negative ions are neutralized in the orifices 4*a*, and to remarkably reduce the intensity of a radiation to be applied to the workpiece X from the plasma.

Some charged particles may pass through the orifices 4*a* in the orifice electrode 4. In order to prevent such charged particles from being applied to the workpiece X, a deflector or an electron trap may be disposed downstream of the orifice electrode 4. A voltage is applied to the deflector in a direction perpendicular to a beam traveling direction to change the traveling direction of charged particles, for thereby preventing the charged particles from being applied to the workpiece X. The electron trap produces a magnetic field of about 100 gauss in a direction perpendicular to a beam traveling direction to change the traveling direction of electrons, for thereby preventing the electrons from being applied to the workpiece X.

As well known in the art, when an insulated workpiece such as a workpiece made of glass or ceramics is processed, charge build-up may be developed on the surface of the insulated workpiece. However, by applying neutralized particles to the insulating workpiece as described above, various processes including an etching process and a deposition process can be performed on the insulating workpiece with high accuracy in such a state that an amount of charge build-up is reduced. Various types of gases may be introduced into the beam generating chamber 1 according to the type of process to be performed on the workpiece X. For example, in a dry etching process, oxygen or a halogen gas may selectively be used according to the kind of the workpiece X.

In the present embodiment, it is desirable to introduce a gas that is liable to generate negative ions, such as $O_2$, $Cl_2$, $SF_6$, $CHF_3$, or $C_4F_8$, into the beam generating chamber 1. When the application of the high-frequency voltage is interrupted after a high-density plasma is generated by the aforementioned high-frequency inductive coupling (ICP) with use of the above gas, a large number of negative ions can be generated in the plasma. Therefore, it is easy to accelerate and neutralize the negative ions.

Figure 4:
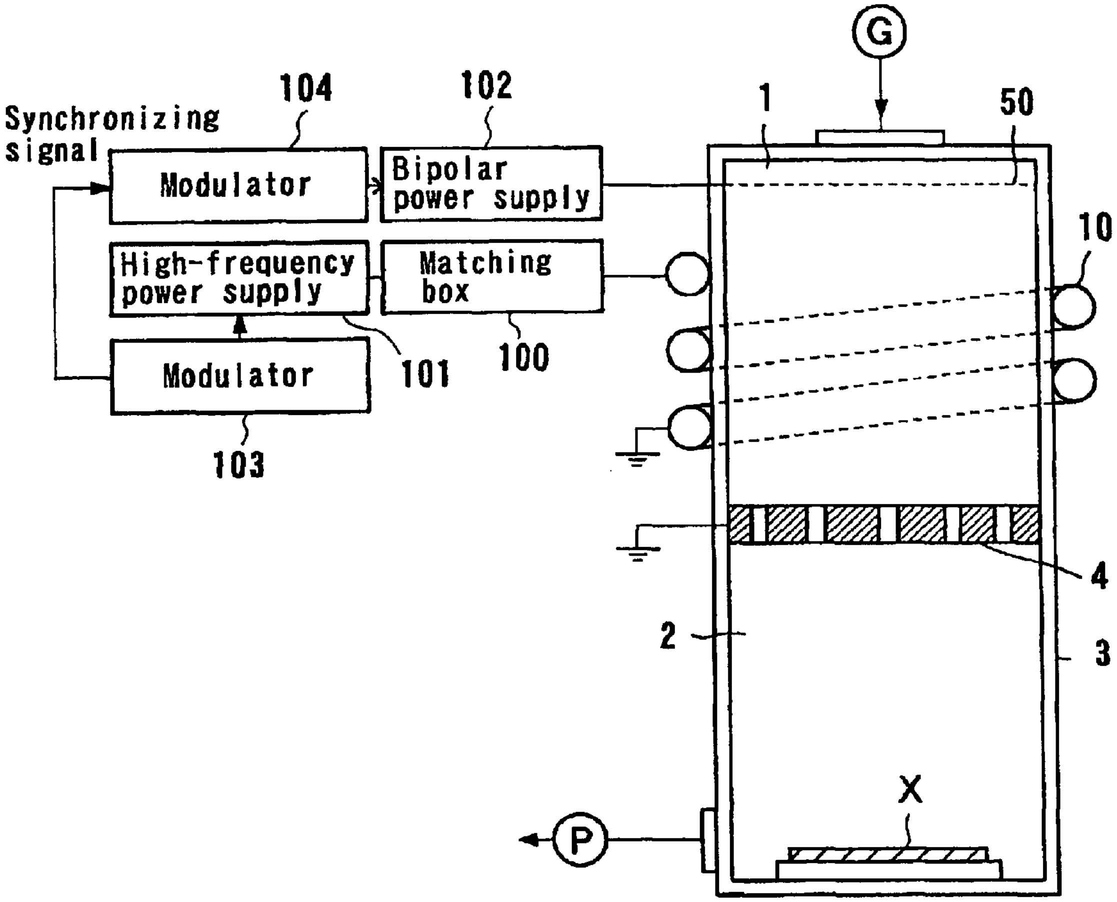
FIG. 4 is a schematic view showing a whole arrangement of a neutral particle beam processing apparatus according to a modification of the first embodiment of the present invention.

In the first embodiment, the grid electrode 5 is positioned downstream of the coil 10. However, the grid electrode may be positioned upstream of the coil 10. In such a case, the grid electrode may have no grid holes therein. FIG. 4 is a schematic view showing a whole arrangement of a neutral particle beam processing apparatus where a grid electrode 50 is disposed upstream of the coil 10. In the neutral particle beam processing apparatus shown in FIG. 4, negative ions in a plasma generated in the beam generating chamber 1 are accelerated by a voltage applied between the grid electrode 50 and the orifice electrode 4.

In the above embodiment, the plasma is generated with use of a coil for ICP. However, the plasma may be generated with use of an electron cyclotron resonance source (ECR source), a coil for helicon wave plasma, a microwave, or the like.

Figure 5:
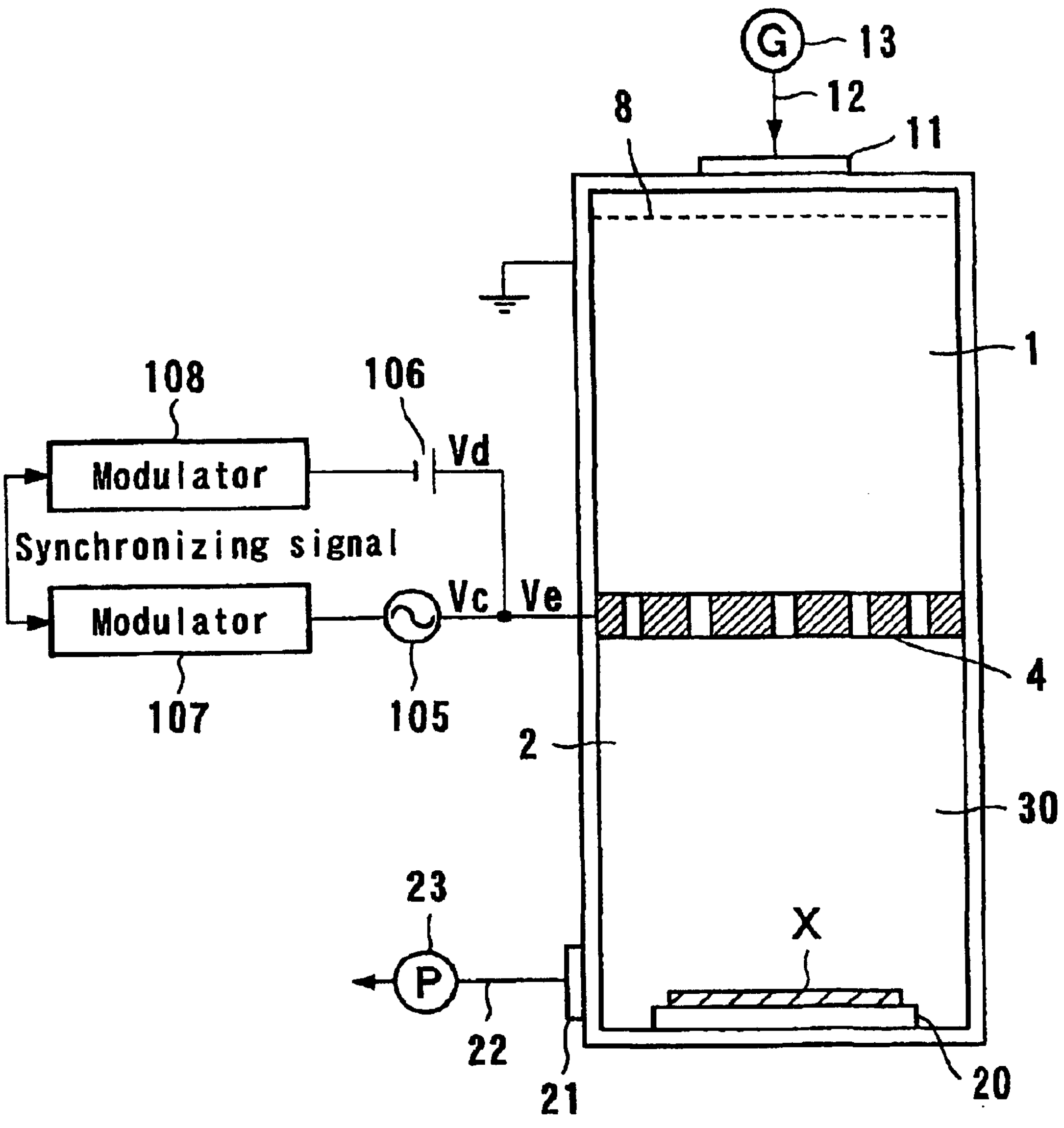
FIG. 5 is a schematic view showing a whole arrangement of a neutral particle beam processing apparatus according to a second embodiment of the present invention.
Figure 6:
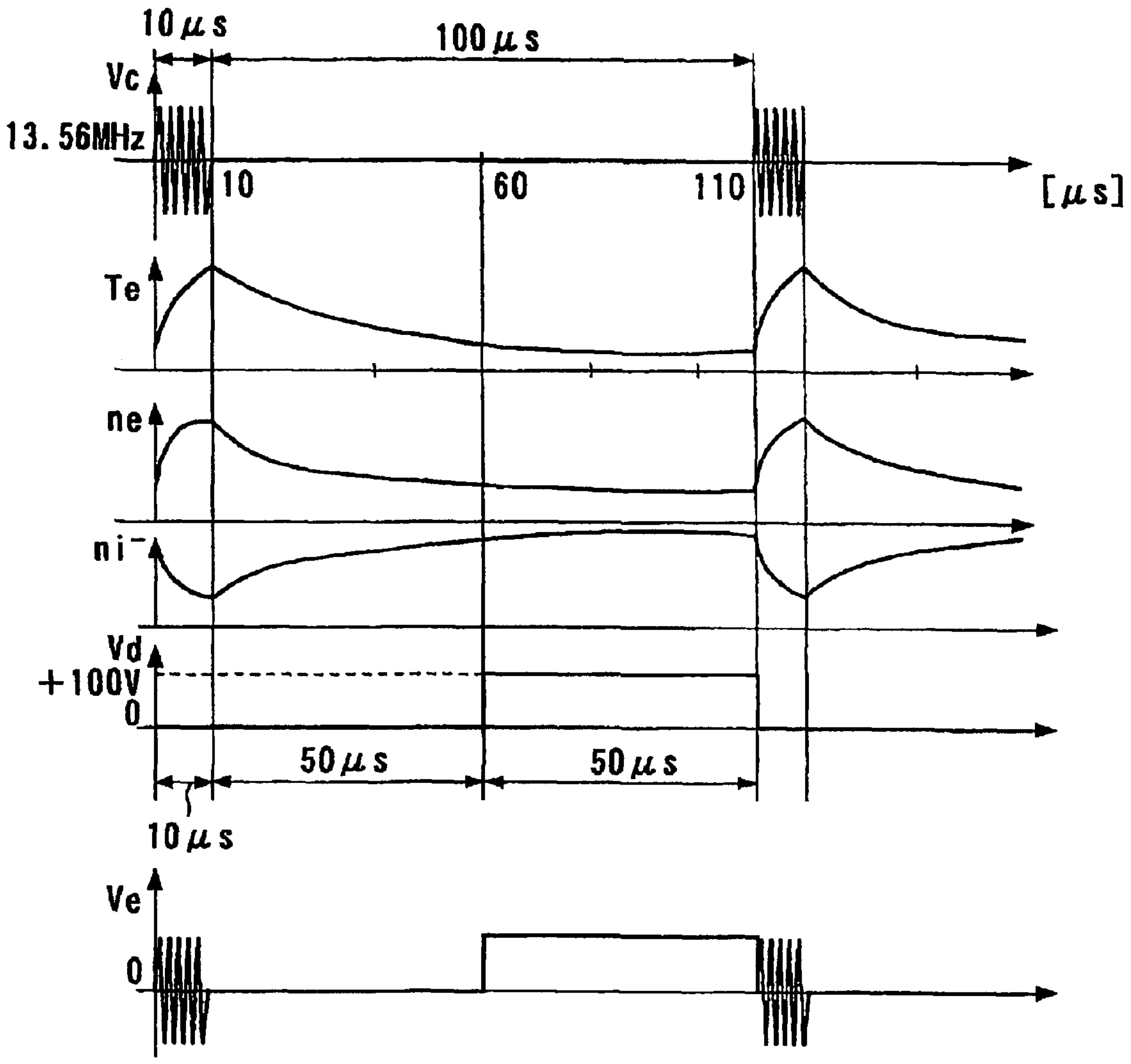
FIG. 6 is a timing chart showing operating states of the neutral particle beam processing apparatus shown in FIG. 5.

A neutral particle beam processing apparatus according to a second embodiment of the present invention will be described below with reference to FIGS. 5 and 6. FIG. 5 is a schematic view showing a whole arrangement of a neutral particle beam processing apparatus according to a second embodiment of the present invention, with electric components in block form. In FIG. 5, like parts and components are denoted by the same reference numerals and characters as those of the first embodiment and will not be described below.

In the present embodiment, the neutral particle beam processing apparatus comprises a vacuum chamber 30 made of metal, i.e., a metallic chamber. As shown in FIG. 5, a thin-plate grid electrode (second electrode) 8 made of an electrically conductive material is disposed in an upstream end of the vacuum chamber 30. The vacuum chamber 30 and the grid electrode 8 are electrically connected to each other and electrically grounded.

An AC power supply (first voltage applying unit) 105 and a DC power supply (second voltage applying unit) 106, which are connected parallel to each other, are electrically connected to the orifice electrode 4. The power supplies 105, 106 are also connected to modulators 107, 108, respectively. The modulator 107 for the AC power supply 105 and the modulator 108 for the DC power supply 106 are synchronized with each other by synchronizing signals. The vacuum chamber 30 and the orifice electrode 4 are electrically insulated from each other by an insulating material (not shown). The surfaces of the orifice electrode 4 may be covered with dielectric films.

Operation of the neutral particle beam processing apparatus according to the second embodiment will be described below. FIG. 6 is a timing chart showing operating states of the neutral particle beam processing apparatus shown in FIG. 5. In FIG. 6, Vc represents the potential of the AC power supply 105, Te the electron temperature in the beam generating chamber 1, ne the electron density in the beam generating chamber 1, $ni^-$ the negative ion density in the beam generating chamber 1, Vd the potential of the DC power supply 106, and Ve the potential of the orifice electrode 4. The timing chart is schematically shown in FIG. 6, and the shown frequencies are different from the actual frequencies, for example.

The vacuum pump 23 is driven to evacuate the vacuum chamber 30, and then a gas is introduced from the gas supply source 13 into the beam generating chamber 1. As shown in FIG. 6, a high-frequency voltage having a frequency of about 13.56 MHz is applied to the orifice electrode 4 for 10 microseconds by the AC power supply 105, so that a high-frequency electric field is produced in the beam generating chamber 1. The gas introduced into the beam generating chamber 1 is ionized by electrons that are accelerated by the high-frequency electric field, for thereby generating a high-density plasma in the beam generating chamber 1.

Then, the high-frequency voltage applied by the AC power supply 105 is interrupted for 100 microseconds. Thereafter, the high-frequency voltage is applied again to the orifice electrode 4 for 10 microseconds by the AC power supply 105 to heat the electrons in the plasma in the beam generating chamber 1. Thus, the above cycle is repeated. In this manner, the application of the high-frequency voltage for 10 microseconds and the interruption of the high-frequency voltage for 100 microseconds are alternately repeated.

Negative ions can be generated efficiently and continuously by interrupting the high-frequency voltage after the energy of the electrons is increased in the plasma. While ordinary plasmas are mostly composed of positive ions and electrons, the neutral particle beam processing apparatus according to the present embodiment can efficiently generate a plasma in which positive ions and negative ions coexist therein.

After 50 microseconds from the time when the high-frequency voltage applied by the AC power supply 105 is stopped, a DC voltage of +100 V is applied to the orifice electrode 4 for 50 microseconds by the DC power supply 106. The application of the DC voltage increases the potential Ve of the orifice electrode 4 above the potential (ground potential) of the grid electrode 8. Thus, a potential difference is produced between the orifice electrode 4 and the grid electrode 8. In this state, the orifice electrode 4 serves as an anode, and the grid electrode 8 serves as a cathode. Therefore, the negative ions present between the grid electrode 8 and the orifice electrode 4 are accelerated toward the orifice electrode 4 by the potential difference and introduced into the orifices 4*a* defined in the orifice electrode 4.

Most of the negative ions that are passing through the orifices 4*a* are neutralized and converted into neutral particles as in the case of the first embodiment. The neutral particles are then emitted as an energetic beam into the process chamber 2. The neutral particles travel directly in the process chamber 2 and are applied to the workpiece X placed on the workpiece holder 20.

According to the second embodiment, as described above, by alternately applying the high-frequency voltage and the low-frequency voltage between the orifice electrode 4 and the grid electrode 8, a plasma can be generated in the beam generating chamber, and negative ions can be extracted from the generated plasma. Therefore, it is not necessary to provide a separate plasma generator for generating a plasma. Thus, the neutral particle beam processing apparatus can be made compact in structure, and a beam diameter of an energetic beam can be increased inexpensively.

The frequency of the high-frequency voltage is not limited to 13.56 MHz, but may be in the range from 1 MHz to 20 GHz.

Although certain preferred embodiments of the present invention have been shown and described in detail, it should be understood that various changes and modifications may be made therein without departing from the scope of the appended claims.

INDUSTRIAL APPLICABILITY

The present invention is suitable for use in a neutral particle beam processing apparatus for generating a highly directional and highly dense neutral particle beam from a high-density plasma and processing a workpiece with the generated neutral particle beam.

What is claimed is:

1. A neutral particle beam processing apparatus comprising:

a workpiece holder for holding a workpiece;

a plasma generator for generating a plasma in a vacuum chamber by applying a high-frequency electric field;

an orifice electrode disposed between said workpiece holder and said plasma generator, said orifice electrode having orifices defined therein;

a grid electrode disposed upstream of said orifice electrode in said vacuum chamber; and a voltage applying unit for applying a direct current voltage between said orifice electrode which serves as an anode and said grid electrode which serves as a cathode, while the high-frequency electric field applied by said plasma generator is being interrupted, to accelerate negative ions in the plasma generated by said plasma generator and pass the accelerated negative ions through said orifices in said orifice electrode.

2. A neutral particle beam processing apparatus according to claim 1, wherein said orifice electrode has a thickness which is at least twice the diameter of said orifices defined therein.

3. A neutral particle beam processing apparatus according to claim 1, wherein said orifice electrode is made of an electrically conductive material.

4. A neutral particle beam processing apparatus according to claim 1, wherein said plasma generator is configured to generate the plasma by inductively coupled plasma.

5. A neutral particle beam processing apparatus according to claim 1, wherein said grid electrode comprises a thin-plate grid electrode made of an electrically conductive material.

6. A neutral particle beam processing apparatus according to claim 1, wherein said orifice electrode serves to prevent a radiation produced by the plasma from being applied to the workpiece.

7. A neutral particle beam processing apparatus according to claim 1, further comprising a deflector disposed downstream of said orifice electrode for preventing charged particles from being applied to the workpiece.

8. A neutral particle beam processing apparatus according to claim 1, further comprising an electron trap disposed downstream of said orifice electrode for preventing charged particles from being applied to the workpiece.

9. A neutral particle beam processing apparatus according to claim 1, wherein said orifice electrode is an electrically conductive material.

10. A neutral particle beam processing apparatus comprising:

a workpiece holder for holding a workpiece;

an orifice electrode disposed in a vacuum chamber, said orifice electrode having orifices defined therein;

a second electrode disposed upstream of said orifice electrode in said vacuum chamber;

a first voltage applying unit for applying a high-frequency voltage between said orifice electrode and said second electrode to generate a plasma between said orifice electrode and said second electrode; and a second voltage applying unit for applying a direct current voltage between said orifice electrode which serves as an anode and said second electrode which serves as a cathode, while the high-frequency voltage applied by said first voltage applying unit is being interrupted, to accelerate negative ions in the plasma generated by said first voltage applying unit and pass the accelerated negative ions through said orifices in said orifice electrode.

11. A neutral particle beam processing apparatus according to claim 10, wherein said orifice electrode has a thickness which is at least twice the diameter of said orifices defined therein.

12. A neutral particle beam processing apparatus according to claim 10, wherein said orifice electrode is made of an electrically conductive material.

13. A neutral particle beam processing apparatus according to claim 10, wherein said orifice electrode serves to prevent a radiation produced by the plasma from being applied to the workpiece.

14. A neutral particle beam processing apparatus according to claim 10, further comprising a deflector disposed downstream of said orifice electrode for preventing charged particles from being applied to the workpiece.

15. A neutral particle beam processing apparatus according to claim 10, further comprising an electron trap disposed downstream of said orifice electrode for preventing charged particles from being applied to the workpiece.

16. A neutral particle beam processing apparatus according to claim 10, wherein said orifice electrode is an electrically conductive material.

* * * * *